(12) United States Patent
Seng et al.

(10) Patent No.: US 6,765,378 B2
(45) Date of Patent: Jul. 20, 2004

(54) TEST HANDLER APPARATUS FOR SMD (SURFACE MOUNT DEVICES), BGA (BALL GRID ARRAYS) AND CSP (CHIP SCALE PACKAGES)

(75) Inventors: Lee Boon Seng, Melaka (MY); Tan Kek Yong, Johor (MY)

(73) Assignee: STMicroelectronics Sdn Bhd, Muar (MY)

( * ) Notice: Subject to any disclaimer, the term of this patent is extended or adjusted under 35 U.S.C. 154(b) by 0 days.

(21) Appl. No.: 10/188,284

(22) Filed: Jul. 1, 2002

(65) Prior Publication Data

US 2003/0020457 A1 Jan. 30, 2003

(30) Foreign Application Priority Data

Jun. 30, 2001 (MY) .................................. PI 2001 3142

(51) Int. Cl.[7] .............................................. G01R 31/26
(52) U.S. Cl. ................................ 324/158.1; 324/765
(58) Field of Search ............................. 324/765, 158.1; 209/573, 909; 414/940

(56) References Cited

U.S. PATENT DOCUMENTS

| 5,646,776 A | * | 7/1997 | Bacchi et al. ................ 359/393 |
| 6,104,183 A | * | 8/2000 | Kobayashi et al. ...... 324/158.1 |
| 6,515,470 B2 | * | 2/2003 | Suzuki et al. ............ 324/158.1 |

* cited by examiner

*Primary Examiner*—David A. Zarnder
*Assistant Examiner*—Tung X. Nguyen
(74) *Attorney, Agent, or Firm*—Lisa K. Jorgenson; Robert Iannucci; Seed IP Law Group, PLLC

(57) ABSTRACT

A test handler apparatus, having a treatment area; a testing station in the treatment area; and an output unit connected to an output of the treatment area. An input unit picks singulated or stripped packages and unloads them on carrier boats in a loading zone; a conveyor mechanism transfers the carrier boats from the loading zone through the treatment area to the testing station and from the testing station to the output unit. In practice, the carrier boat forms a universal carrier which is able to contain multiple singulated or strip packages for the purpose of testing. Placing packages onto carriers with standardized dimension allows handler equipment to accommodate the packages in singulated or strip condition.

23 Claims, 8 Drawing Sheets

TEST HANDLER APPARATUS FOR SMD (SURFACE MOUNT DEVICES), BGA (BALL GRID ARRAYS) AND CSP (CHIP SCALE PACKAGES)

BACKGROUND OF THE INVENTION

1. Field of the Invention

The present invention relates to a test handler apparatus for SMD (surface mount devices), BGA (ball grid arrays) and CSP (chip scale packages).

2. Description of the Related Art

As known, a wide variety of packages has been developed for integrated circuit application. These packages are used in surface mount devices (SMD), Ball Grid Arrays (BGA) and chip scale packages (CSP). After these packages have been fabricated or sealed, their parameters need to be compared to both the technical specification and the customer requirements. Commercially available testing systems can be categorized as a standalone or automated handling system with limited flexibility and capacity.

Critical issues of testing include how to increase productivity, how to avoid lead/ball damage, how to cope with operational and maintenance consequences as a result of package changes.

A prior art testing includes steps of input transfer, hot/ambient chamber treating, package transportation, testing and output transfer. Input transfer involves loading from stacked trays when operated as standalone or direct loading from the previous operation when connected in an inline system.

BRIEF SUMMARY OF THE INVENTION

One embodiment of the invention improves the throughput of the handling equipment with multiple matrix units testing, either for singulated or strip packages of the embodiment eliminates changing tester load board/test contacts block.

According to an embodiment of the invention, package handling improvement is achieved by modifying the holding mechanism design. In particular, according to one aspect of the invention, a universal carrier is provided which is able to contain multiple singulated or strip packages for the purpose of testing.

Placing packages onto carriers with standardized dimensions allows handler equipment to accommodate the packages in singulated or strip condition. The handler equipment would deliver them to the tester for testing.

According to an embodiment of the invention, the test handler apparatus for testing SMD, BGA and CSP packages comprises the following elements:

An input transfer means;
A hot/ambient chamber;
A carrier transportation means;
A universal carrier mechanism;
A universal matrix test-site contact assembly;
A ganged matrix singulated testing;
A matrix strip package testing
An output transfer means.

BRIEF DESCRIPTION OF THE SEVERAL VIEWS OF THE DRAWING(S)

For the understanding of the present invention, a preferred embodiment is now described, purely as a non-limitative example, with reference to the enclosed drawings, wherein.

DETAILED DESCRIPTION OF THE INVENTION

Figure 1:
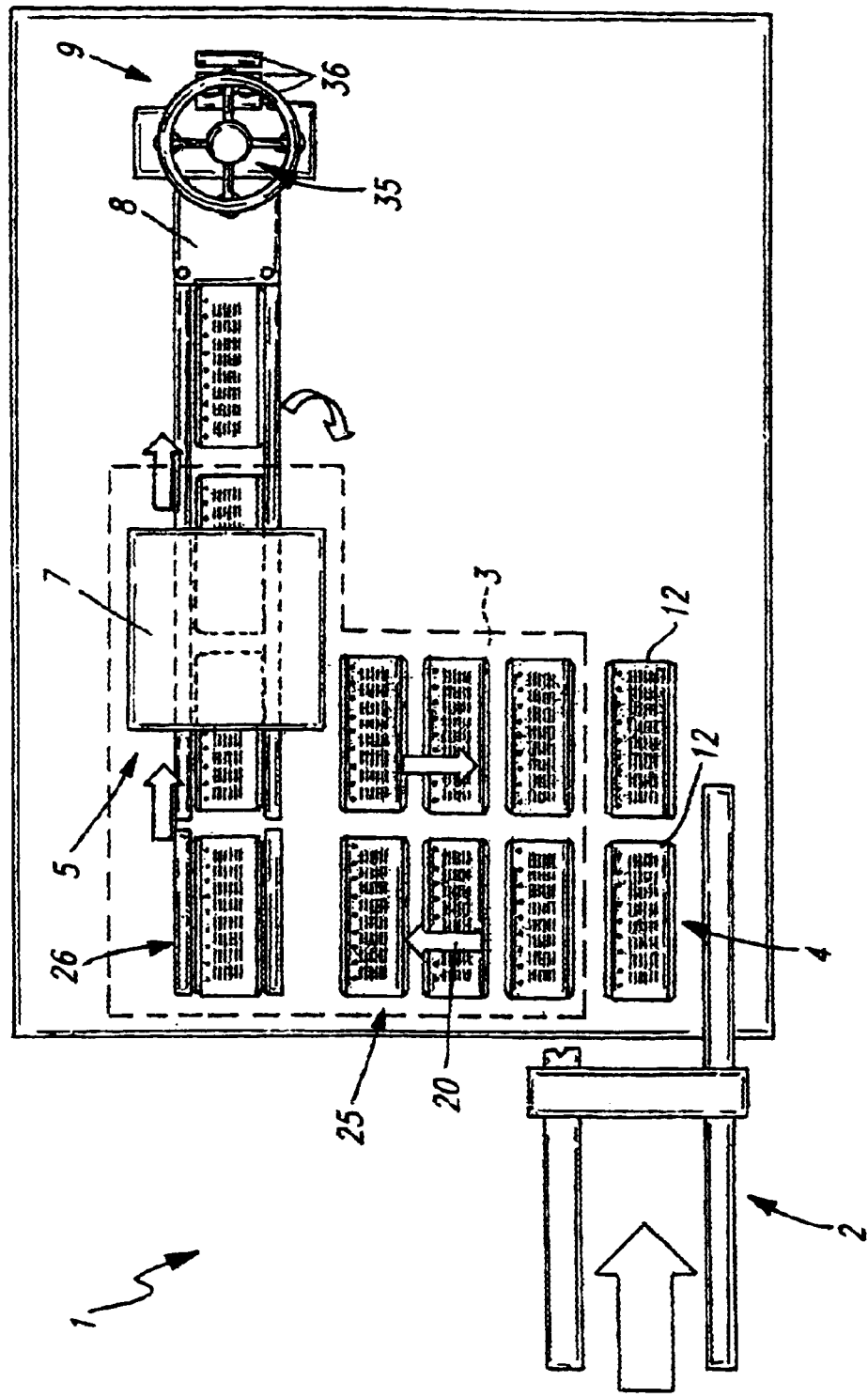
FIG. 1 shows a plan view from above of a handing apparatus according to the invention.
Figure 2:
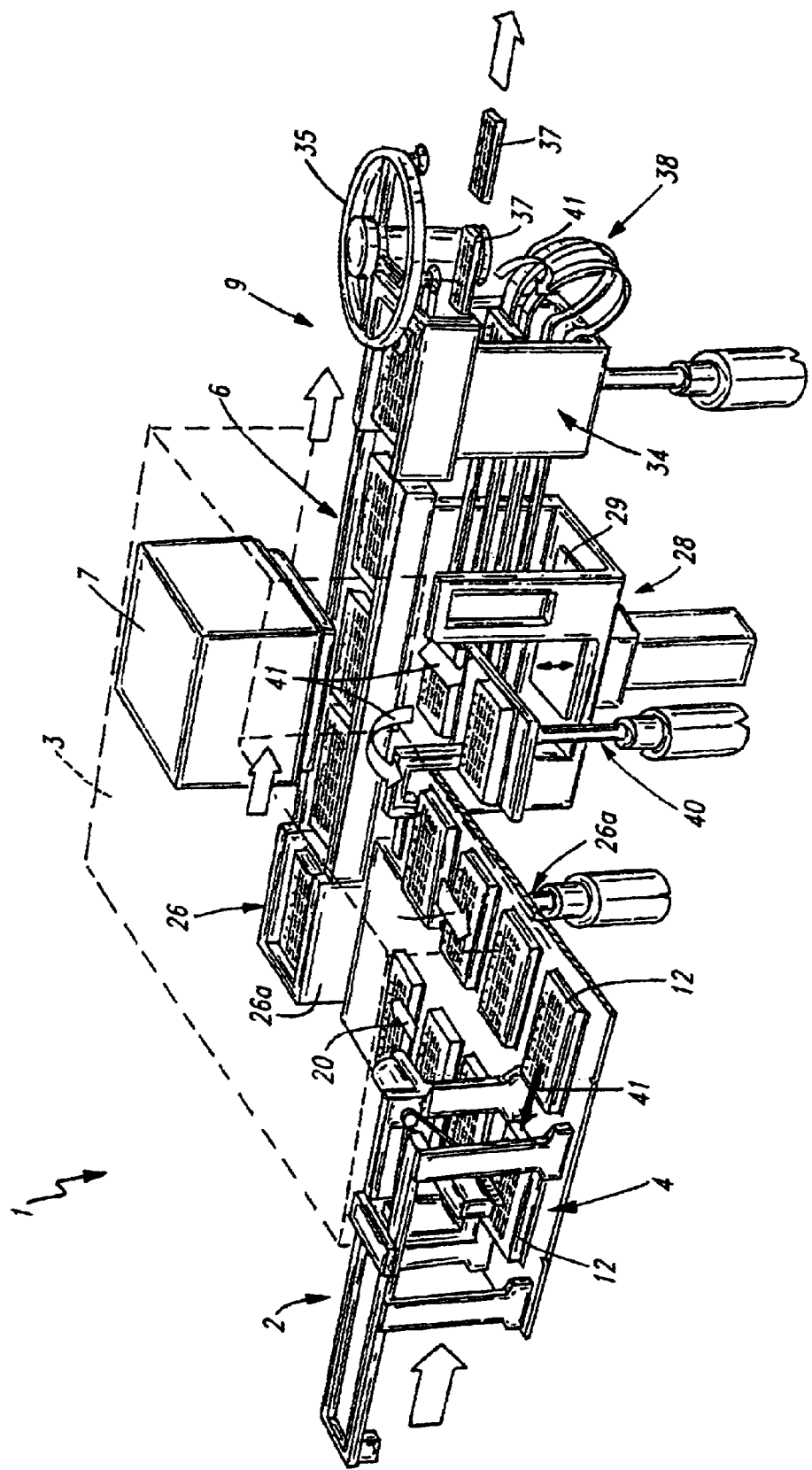
FIG. 2 is a perspective view of the handling apparatus of FIG. 1.

With reference to FIGS. 1, 2, a test handler apparatus 1 comprises an input unit 2; a hot/ambient chamber 3; a loading zone 4; carrier boat transfer mechanisms 20, 6, 47; a testing station 5; a test head 7 in the testing station 5; a singulation station 8; and an output unit 9.

In detail, the input unit 2 picks up a gang of matrix singulated packages 30 (FIG. 3b) or a strip of packages (FIG. 3c), processed by the previous operation. The invention can be designed to handle different quantities of packages 30.

Figure 3A:
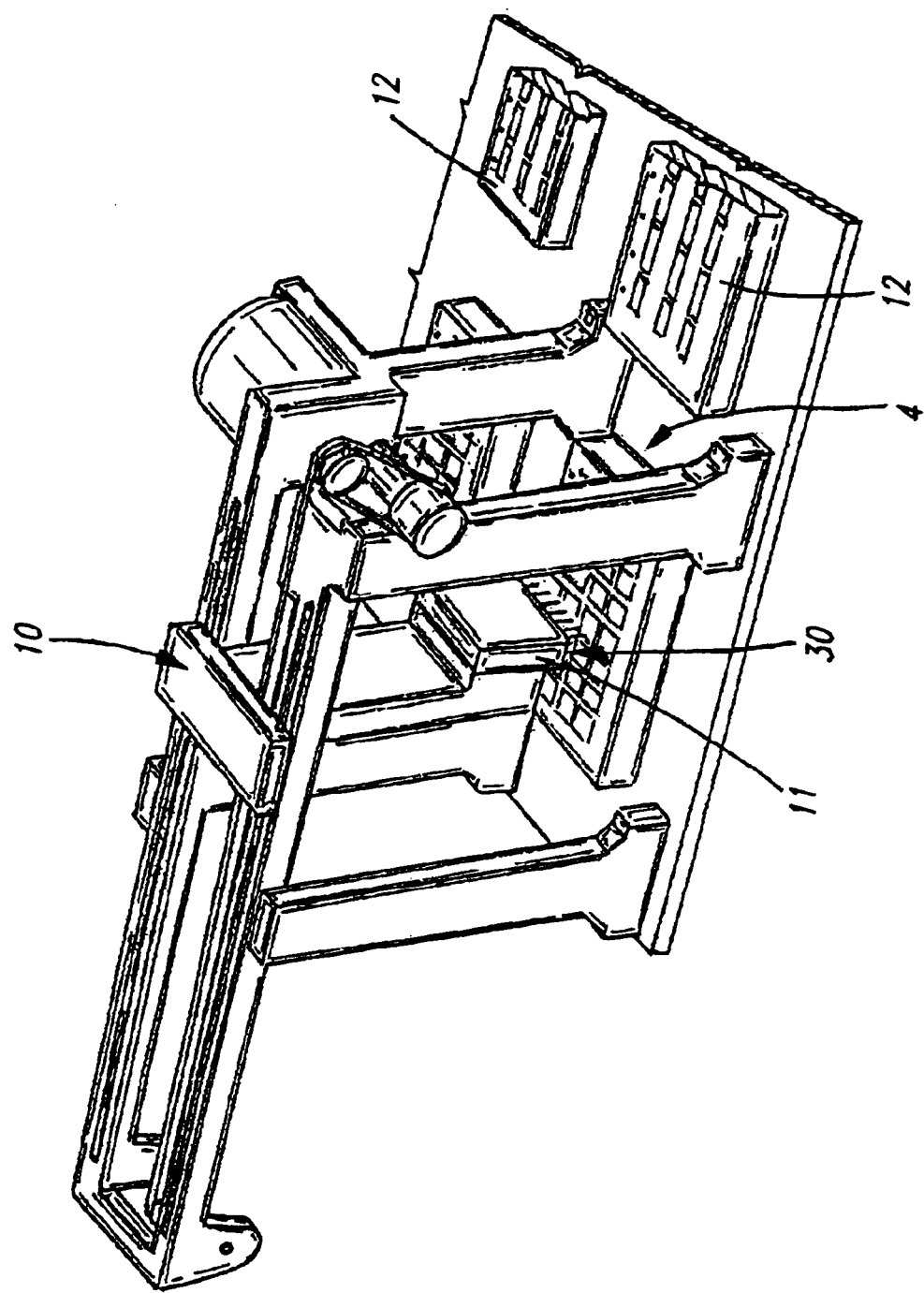
FIG. 3a is a perspective view of a package input transfer unit.
Figure 3C:
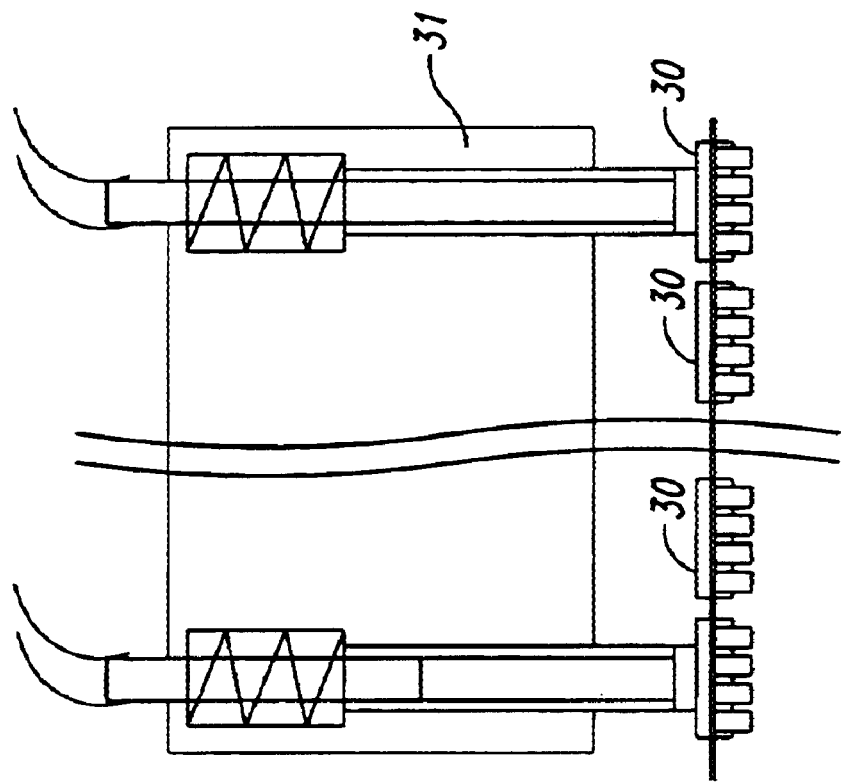
FIGS. 3b and 3c show cross-sections of the package input transfer unit of FIG. 3a, for singulated and stripped packages, respectively.
Figure 3B:
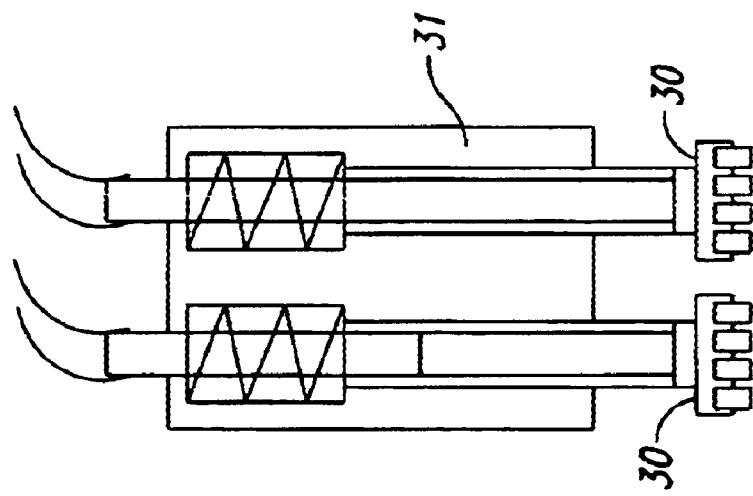

The structure of the input unit 2 is shown in FIG. 3a and comprises a slide 10 movable along a horizontal path and carrying a vertically slidable transfer arm 11. The transfer arm 11 picks up the packages 30 (either in a strip or singulated) from a previous package manufacturing unit (not shown) and holds them by means of a vacuum system with individual sensors to detect the presence of package 30 during the transfer. Details of the input unit 2 gripping singulated packages 30 and stripped packages 30 are shown in FIGS. 3b and 3c, respectively. The packages 30 are placed onto carrier boats 12 in the loading zone 4, near the hot/ambient chamber 3. The singulated packages 30 of a frame are all taken together, with the same pitch as in a strip and then deposited in the same arrangement onto one carrier boat 12.

The carrier boats 12 (see FIGS. 4a, 4b) comprise a plurality of seats 15 (better shown in the cross section of FIG. 6), one for each package 30, and cavities 16 for the pins. The seats are arranged in a matrix arrangement, with rows extending transversely to the feeding direction in the testing station 5. Furthermore, each carrier boat 12 comprises a plurality of test head locating holes 17 extending on a side of the carrier boats 12 at constant pitch, and strip clampers 18, for holding a strip in the desired position. The carrier boats 12 also include lead frame location pins (not shown) for correctly locating a strip, and holes in the bottom (not shown), to allow gripping by a gripper of the carrier boat transfer mechanisms. The test head locating holes 17 are aligned on a line in the feeding direction in the testing station 5; alternatively they are provided on both sides of the carrier boats 12. Generally, one test head locating hole 17 is provided for two rows of seats 15 (two rows of packages 30), so that two rows of packages 30 are tested simultaneously.

Figure 4B:
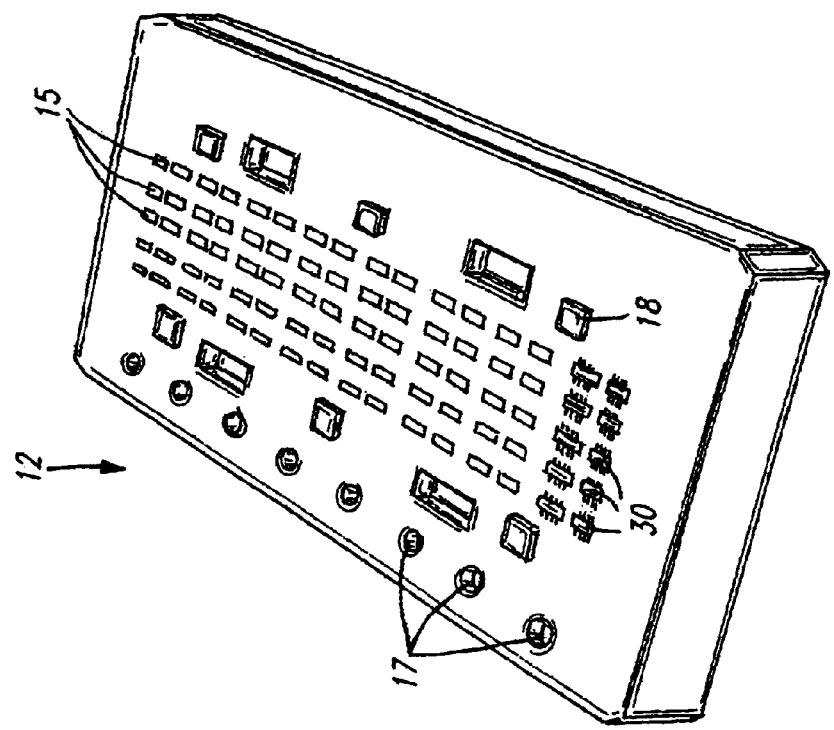
FIGS. 4a and 4b are perspective views of a package carrier loaded with a formed strip and singulated packages, respectively.
Figure 4A:
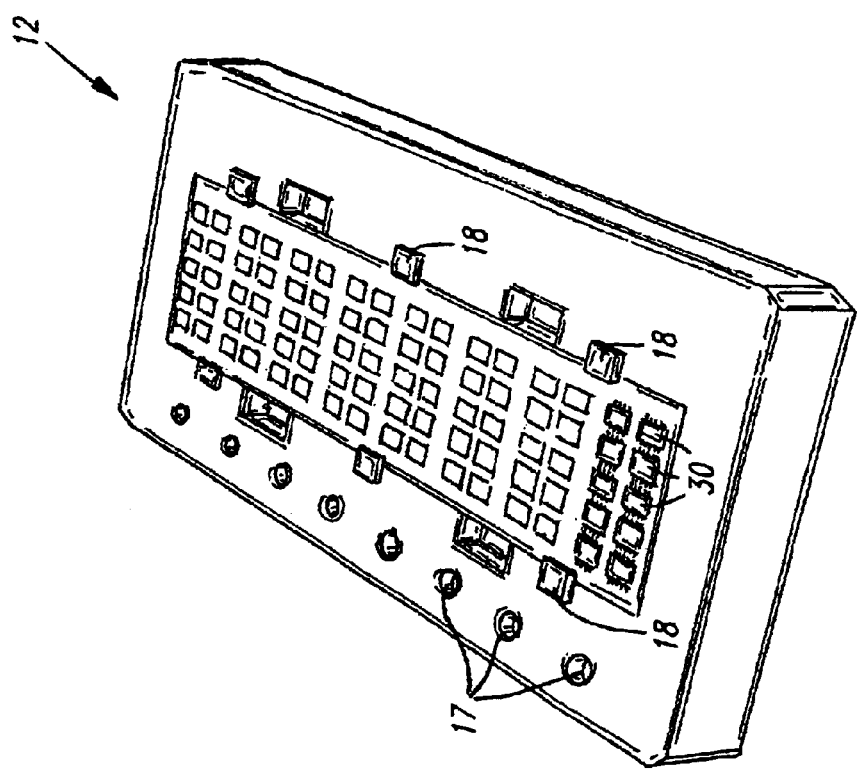

The shape, position and number of the seats 15 and the cavities 16 depend on the specific packages 30 and frames the carrier boats 12 are intended for, and are the same for strip packages and singulated packages 30 of the same type, as visible from FIGS. 4a, 4b.

Figure 5A:
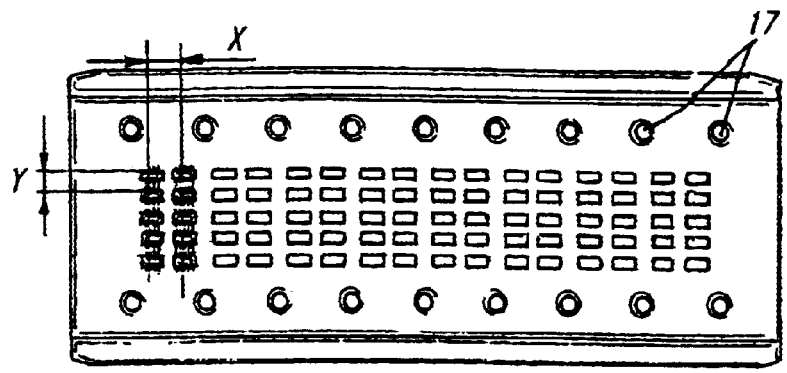
FIGS. 5a, 5b, 5c show different layouts of the package carrier of FIGS. 4a, 4b.
Figure 5B:
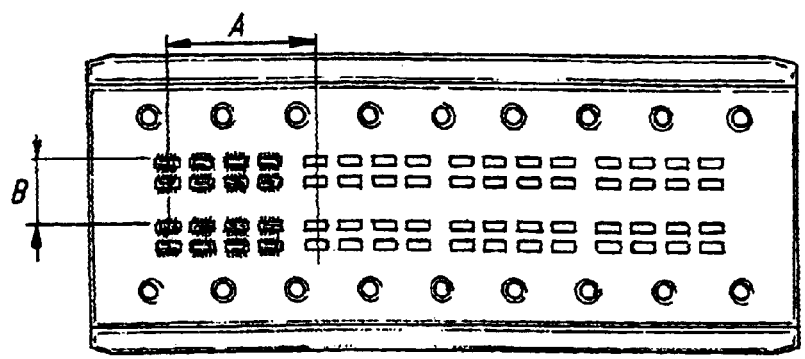
Figure 5C:
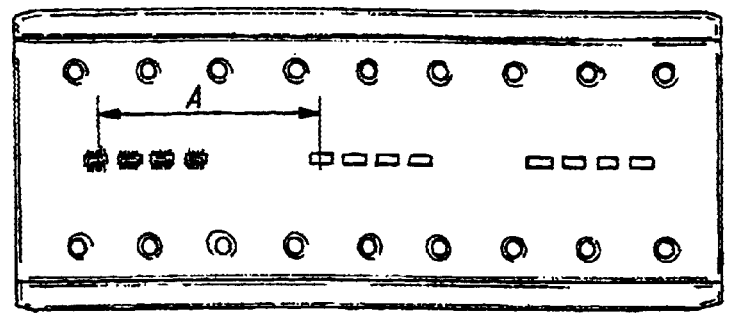

Exemplary layouts of the seats 15 in each carrier boat 12 for different-configuration packages 30 and/or frames are shown in FIGS. 5a–5c. In FIG. 5a, X is the pitch between two units along the x-axis, and may range from 3 mm to 450 mm; Y is the pitch between two units along the y-axis, and may range from 3 mm to 110 mm. The number of rows (in the x-axis direction) and columns (in the y-axis direction) may range from 1 to 50.

In FIG. 5b, the seats 15 are arranged in islands of two rows and four columns. A is the pitch between two islands along the x-axis and may range from 6 mm to 450 mm; B is the pitch between two islands along the y-axis and may range from 6 mm to 110 mm. The number of islands (in the x-axis and y-axis direction) may range from 1 to 50.

In FIG. 5c single islands are aligned in the x-axis; each island comprises a minimum of two seats in the x- or y-axis direction, wherein A has the same meaning and values indicated for FIG. 5b.

Referring again to FIGS. 1, 2, the carrier boats 12, after loading with the singulated packages 30 or entire strips by the input unit 2, are advanced within the hot/ambient chamber 3 along the direction of the arrow 20 by means of a first carrier boat transfer mechanism of any known structure, for example comprising a gripper engaging bottom holes in the carrier boats 12, and brought to a hot plate unit 25. Here, if testing so requires, the underside of an overlying carrier boat 12 is heated by a heating means to a predetermined temperature. Inside the hot/ambient chamber 3, the packages 30 on the carrier boat 12 are held for a certain time period, preferably two minutes. In the alternative, if testing does not require heating of the packages 30, carrier boats 12 are held in ambient environment.

Thereafter, a carrier boat 12 is transferred onto an input adapter 26 including a first lifter 26a and a gripper 26b (FIG. 7) engaging the carrier boats 12 from below.

Figure 7:
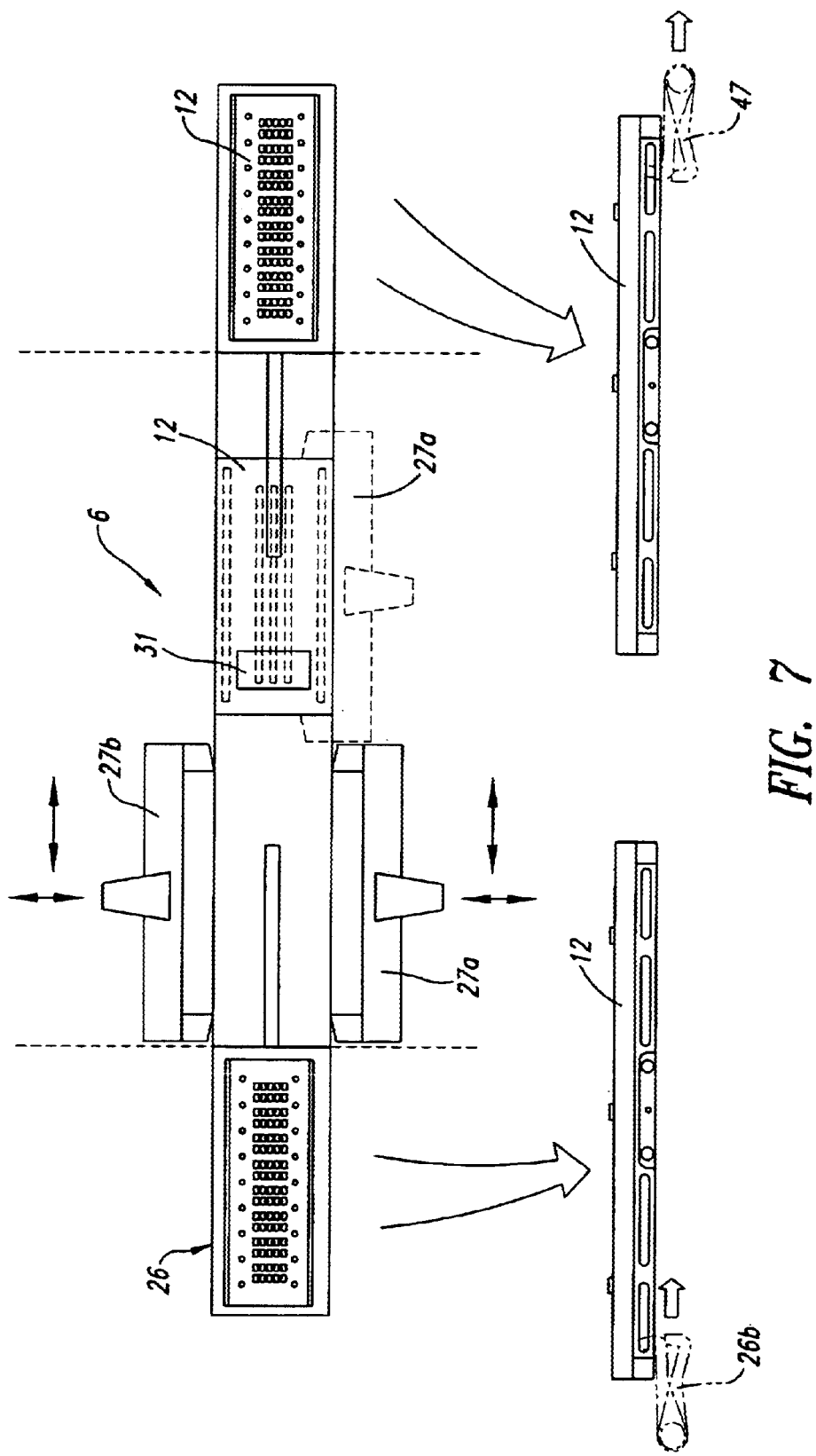
FIG. 7 is a plan view of the testing station.

The input adapter 26 feeds each carrier boat 12 to a second carrier boat transfer mechanism 6, including a pair of jaws 27a, 27b arranged each on a respective side of the transportation path. As shown in FIG. 7 (showing the jaws 27a, 27b with continuous line in the rest position and the jaw 27a with dotted line in the 0 position at the end of testing), the jaws 27a, 27b operate alternatively to grip each one carrier boat 12 and index it below the test head 7. The jaws 27a, 27b advance each carrier boat 12 of a step corresponding to the pitch of the test head locating holes 17 to allow testing of a group of packages 30 associated with a test head locating hole 17.

Specifically, with reference to FIG. 7, a first of the two jaws, for example jaw 27a, moves toward a facing carrier boat 12, grips it and advances it under the test head 7 to bring a first group of packages 30 in the test position. After testing of the first group (as below explained), the first jaw 27a advances the carrier boat 12 of a step and so on until the last group of packages 30 has been tested (dotted position). Then, simultaneously, the first jaw 27a moves away from the tested carrier boat 12 while the second jaws 27b moves toward a subsequent carrier boat 12 (brought to the gripping position by the input adapter 26) and grips it. During the advancement of the second jaw 27b, the first jaw 27a returns in the rest position, ready for gripping a further carrier boat 12, at the end of testing of the carrier boat 12 gripped by the second jaw 27b.

After each advancement of a carrier boat 12 in the testing station 5, a second lifter 28 having a platform 29 lifts the carrier boat 12 to the test head 7. The test head 7 is located stationary above the transportation track. To increase precision in positioning the carrier boat 12 to be tested, conical pins (not shown) are provided below the test head 7 for engaging the test head locating holes 17. Along the transportation track in the testing station 27, the packages 30 are held against the respective carrier boat 12 by vacuum, as shown in FIG. 6 by arrows 45.

Figure 6:
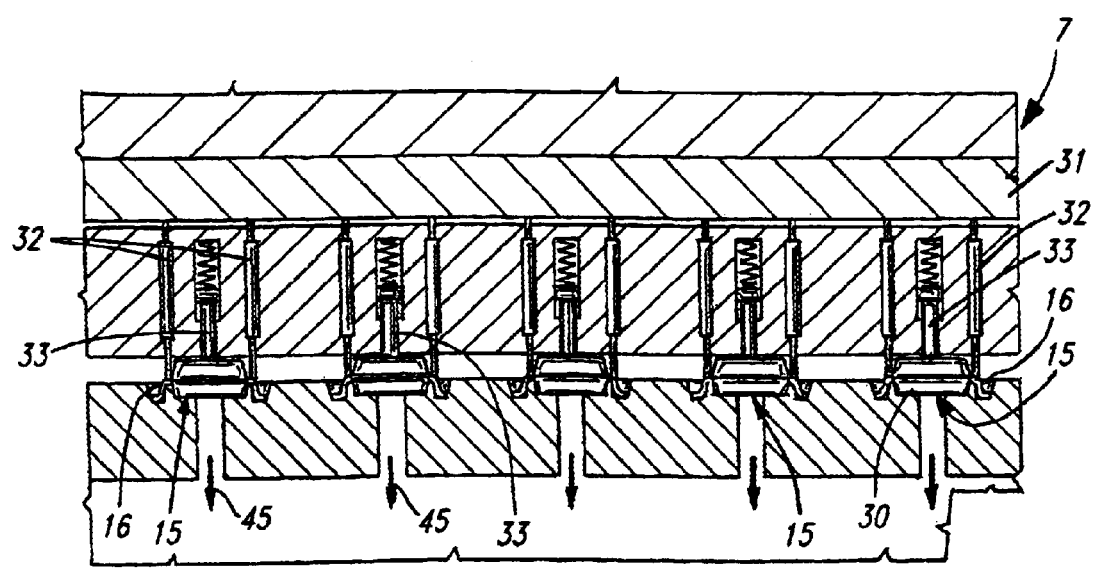
FIG. 6 shows a cross-section of a tester head.

After a carrier boat 12 is docked, a group of packages 30 is tested electrically, as shown in FIG. 6, in accordance with the test specification required in particular, testing of packages 30 is made via test fingers or pins 32 mounted on a tester head contact block 31 belonging to the test head 7 and in contact with the top surface of the formed leads extending from the package 30 to the end of leads (lead shoulders). The testing fingers or pins 32 can be single or Kelvin contacts.

The test result will be communicated to the handling equipment, in a per se known manner, and its status is stored in a memory. Upon completion of testing of a group of packages 30, the carrier boat 12 is moved down by the second lifter 28 and indexed one pitch by the respective jaw 27a, 27b to present the next group of packages 30 for testing. To ensure detaching of the packages 30 from the tester head contact block 31 and in particular from the test fingers or pins 32, the tester head contact block 31 comprises a plurality of a stripper pins 33, one for each package 30 just tested; that maintain the packages 30 against the respective carrier boat 12 and avoid any sticking.

Then, the second lifter 28 moves the carrier boat 12 upwards to put another group of the packages 30 in contact with the contact fingers or pins 32 to do the testing. This process repeats until all the packages 30 are tested.

A gripper 47 engages carrier boats 12 that have completed testing and takes them to the output of hot/ambient chamber 3. Outside the hot/ambient chamber 3, the singulation station 8 singulates the strip packages, but is, inactive in case of already singulated packages 30.

Then, as shown in FIG. 2 (wherein the singulating station 8 has been omitted for clarity), at the output unit 9, including an output adapter 34 and a miniturret 35, packages 30 are removed from the carrier boats 12 and sorted through by the miniturret 35; rejected packages 30 are brought to rejects bins 36 (FIG. 1) good packages 30 are loaded onto output shuttles 37 that move them to the next operation, and empty carrier boats 12 are circulated, through a belt conveyor 38 and a third lifter 40, to the loading zone 4, for loading further packages 30, in singulated or strip condition, as shown by arrows 41.

Some advantages of the test handier apparatus 1 are the following. The test handler apparatus is of universal application and may treat any type of packages, either singulated or stripped, by virtue of the use of carrier boats adapted to the type and configuration packages. Thus, for treating different type packages, 5 it is only necessary to provide carrier boats 12 with the specific seats and cavities layout.

The matrix-like arrangement of the seats 15 and its arrangement according to the specific frame of the packages allows the same carrier boats 12 to be used for singulated and stripped packages with a same shape and frame arrangement.

Transfer of the packages 30 is made automatically from the input unit through the entire test handler independently from the singulated and stripped configuration.

The apparatus is able to test packages in parallel using a universal matrix contact test site.

The packages are precisely indexed and positioned at the test head by means of the test head locating holes 17;

furthermore the packages are held in position through vacuum suction and surely released after testing by virtue of the stripper pins.

Finally, it is clear that numerous variations and modifications may be made to the apparatus and method described and illustrated herein, all falling within the scope of the invention as defined in the attached claims.

All of the above U.S. patents, U.S. patent application publications, U.S. patent applications, foreign patents, foreign patent applications and non-patent publications referred to in this specification and/or listed in the Application Data Sheetare incorporated herein by reference, in their entirety.

We claim:

1. A test handler apparatus, comprising:
   a treatment area;
   a testing station in said treatment area;
   an output unit connected to an output of said treatment area;
   an input unit picking up singulated or stripped packages and unloading them on carrier boats in a loading zone; and
   a conveyor mechanism transferring said carrier, boats from said loading zone through said treatment area to said testing station and from said testing station to said output unit, wherein said carrier boats comprise each a plurality of locating holes for precisely locating said carrier boats under a test head in said testing station.

2. An apparatus according to claim 1, wherein said carrier boats have a plurality of matrix-like arranged seats for said packages; said seats having a layout reproducing a frame layout of said packages.

3. An apparatus according to claim 1, wherein said carrier boats are structured to carry both singulated and stripped packages.

4. An apparatus according to claim 3, wherein said carrier boats have clamping means for holding the stripped packages on the carrier boats.

5. An apparatus according to claim 1, wherein said test head includes a locating pin that successively mates with the locating holes of one of the carrier boats to precisely locate the one of the carrier boats under the test head.

6. An apparatus according to claim 1, wherein said input unit comprises vacuum holding means movable from a grabbing position to a releasing position overlying a carrier boat to be loaded, said vacuum holding means picking up all singulated packages of a frame or an entire package strip.

7. An apparatus according to claim 1, wherein said treatment area is a hot/ambient chamber including heating means for heating undersides of said carrier boats.

8. An apparatus according to claim 7, wherein said conveyor mechanism comprise a first carrier boat transfer mechanism carrying said carrier boats from said loading zone over the heating means to a second carrier boat transfer mechanism indexing said carrier boats through said testing station.

9. An apparatus according to claim 1, wherein said output unit removes said packages from said carrier boats; and a conveyor system takes the empty carrier boats to said loading zones.

10. Test handler apparatus, comprising:
    a treatment area;
    a testing station in said treatment area;
    an output unit connected to an output of said treatment area;
    an input unit picking up singulated or stripped packages and unloading them on carrier boats in a loading zone, wherein said treatment area includes a hot/ambient chamber including heating means for heating undersides of said carrier boats; and
    a conveyor mechanism transferring said carrier boats from said loading zone through said treatment area to said testing station and from said testing station to said output unit, wherein said conveyor mechanism includes:
      a first carrier boat transfer mechanism carrying said carrier boats from said loading zone over the heating means to a second carrier boat transfer mechanism indexing said carrier boats through said testing station; and
      an adapter unit, structured to receive said carrier boats from said first carrier boat transfer mechanism and take said carrier boats to a gripping position in said testing station, wherein said second carrier boat transfer mechanism comprises:
        jaws means gripping said carrier boats at said gripping position and indexing said carrier boats under a test head with a precise, predetermined pitch; and
        lifter means, lifting a carrier boat against said test head after each pitch advancement and lowering said carrier boat after test of a group of said packages.

11. An apparatus according to claim 10, wherein said jaw means comprise a pair of jaws arranged laterally to a transportation path of said carrier boats and alternately gripping each a carrier boat.

12. An apparatus according to claim 10, wherein said test head has a plurality of a stripper pins, one for each package to be tested, downwardly protruding and maintaining the packages against a respective carrier boat during carrier board lowering.

13. A test handler apparatus, comprising:
    a plurality of carrier boats that carry integrated circuit (IC) packages;
    a testing station structured to test the IC packages;
    an input unit structured to load the IC packages on the carrier boats; and
    a conveyor mechanism transferring the carrier boats to the testing station; and
    an output unit connected to the conveyor mechanism and structured to remove the IC packages, after testing, from the carrier boats and return the carrier boats to the input unit for loading new IC packages onto the boats, wherein the testing station includes a test head having a locating pin and each of the carrier boats has a plurality of locating holes that successively mate with the locating pin to precisely locate the carrier boat under the test head.

14. The apparatus of claim 13, wherein the carrier boats have a plurality of matrix-like arranged seats for the packages, the seats having a layout reproducing a frame layout of the packages.

15. The apparatus of claim 13, wherein each of the carrier boats has a plurality of clamps that hold the IC packages on the carrier boats.

16. The apparatus of claim 13, further comprising a heater positioned adjacent to the testing station, the heater being structured to heat undersides of the carrier boats prior to testing the IC packages.

17. A test handler apparatus, comprising:
    a plurality of carrier boats that carry integrated circuit (IC) packages;
    a testing station structured to test the IC packages;

an input unit structured to load the IC packages on the carrier boats; and a conveyor mechanism transferring the carrier boats to the testing station; and an output unit connected to the conveyor mechanism and structured to remove the IC packages, after testing, from the carrier boats and return the carrier boats to the input unit for loading new IC packages onto the boats, wherein the conveyor mechanism comprises first and second carrier boat transfer mechanisms, the first carrier boat transfer mechanism carrying the carrier boats from the input unit to the second carrier boat transfer mechanism which carries the carrier boats through the testing station.

18. The apparatus of claim 17, wherein the test station includes a test head that tests the IC packages, the apparatus further comprising a carrier boat lifter at the testing station, the carrier boat lifter being structured to lift each carrier boat to the test head for testing and lower the carrier boat after the test head tests a group of the packages.

19. A test handler apparatus, comprising:

a treatment area that includes a testing station and an output, the testing station including a test head;

an output unit connected to the output of the treatment area;

an input unit that picks up integrated circuit packages and loads the packages on carrier boats in a loading zone;

a conveyor mechanism transferring the carrier boats from the loading zone through the treatment area to the testing station and from the testing station to the output unit; the conveyor mechanism including:
  a first carrier boat transfer mechanism carrying the carrier boats from the loading zone;

a second carrier boat transfer mechanism indexing the carrier boats through the testing station; and an adapter unit structured to receive the carrier boats from the first carrier boat transfer mechanism and take the carrier boats to a gripping position in the testing station, wherein the second carrier boat transfer mechanism comprises a gripper structured to grip the carrier boats at the gripping position and index the carrier boats adjacent to a test head with a precise, predetermined pitch.

20. The apparatus of claim 19, wherein the gripper includes a pair of jaws arranged laterally to a transportation path of the carrier boats and alternately gripping each a carrier boat.

21. The apparatus of claim 19, wherein the test head has a plurality of a stripper pins, one for each package to be tested, downwardly protruding and maintaining the packages against a respective carrier boat during carrier board lowering.

22. The apparatus of claim 19, wherein the testing station includes a locating pin and each of the carrier boats has a plurality of locating holes that successively mate with the locating pin to precisely locate the carrier boat under the test head.

23. The apparatus of claim 19, wherein the second carrier boat transfer mechanism includes lifter means for lifting one of the carrier boats against the test head after each pitch advancement and lowering the one of the carrier boats after test of a group of the packages.

* * * * *

UNITED STATES PATENT AND TRADEMARK OFFICE
CERTIFICATE OF CORRECTION

PATENT NO. : 6,765,378 B2
DATED : July 20, 2004
INVENTOR(S) : Lee Boon Seng et al.

It is certified that error appears in the above-identified patent and that said Letters Patent is hereby corrected as shown below:

Column 5,
Lines 15 and 16, "comprising: a treatment area;" should read as -- comprising a treatment area; --.
Line 23, "said carrier, boats" should read as -- said carrier boats --.
Line 60, "said loading zones." should read as -- said loading zone. --.
Lines 61 and 62, "comprising: a treatment area;" should read as -- comprising a treatment area; --.

Column 6,
Lines 64 and 65, "comprising: a plurality of carrier boats" should read as -- comprising a plurality of carrier boats --.

Signed and Sealed this

Seventh Day of December, 2004

JON W. DUDAS
*Director of the United States Patent and Trademark Office*